United States Patent
Lee et al.

(10) Patent No.: US 11,621,313 B2
(45) Date of Patent: Apr. 4, 2023

(54) DISPLAY APPARATUS INCLUDING MULTIPORTION SPACER

(71) Applicant: SAMSUNG DISPLAY CO., LTD., Yongin-si (KR)

(72) Inventors: Joonik Lee, Yongin-si (KR); Jongin Ahn, Yongin-si (KR); Donghyeon Lee, Yongin-si (KR); Changmoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 147 days.

(21) Appl. No.: 17/129,302

(22) Filed: Dec. 21, 2020

(65) Prior Publication Data

US 2021/0399076 A1 Dec. 23, 2021

(30) Foreign Application Priority Data

Jun. 23, 2020 (KR) .......................... 10-2020-0076766

(51) Int. Cl.
*H01L 27/32* (2006.01)
*H01L 25/18* (2006.01)
(Continued)

(52) U.S. Cl.
CPC .......... *H01L 27/3276* (2013.01); *H01L 25/18* (2013.01); *H01L 51/5253* (2013.01);
(Continued)

(58) Field of Classification Search
CPC ............. H01L 27/3276; H01L 27/3244; H01L 27/3248; H01L 27/3258; H01L 27/3279; H01L 27/3255; H01L 27/3246; H01L 27/3295; H01L 25/18; H01L 51/5253; H01L 51/0097; H01L 51/5284;
(Continued)

(56) References Cited

U.S. PATENT DOCUMENTS

| 4,597,635 A * | 7/1986 | Hoshikawa | ........... G02F 1/1347 349/58 |
| 10,299,390 B2 | 5/2019 | Ki et al. | |

(Continued)

FOREIGN PATENT DOCUMENTS

| KR | 10-2017-0072973 A | 6/2017 |
| KR | 10-2017-0080446 A | 7/2017 |

(Continued)

*Primary Examiner* — Ida M Soward
(74) *Attorney, Agent, or Firm* — Lewis Roca Rothgerber Christie LLP

(57) ABSTRACT

A display apparatus includes a bending area and a non-bending area, a display panel including a first panel area, a second panel area, and a panel bending portion that is bent such that at least a portion of the first panel area overlaps a portion of the second panel area, the display panel may have a curvature in the bending area, and a spacer between the first panel area and the second panel area, the spacer including a first portion in the bending area and a second portion in the non-bending area, wherein the first portion of the spacer is different in material from the second portion, and wherein the first portion of the spacer may have a curvature in the bending area substantially equal to a curvature of the display panel in the bending area.

20 Claims, 9 Drawing Sheets

(51) Int. Cl.
*H01L 51/00* (2006.01)
*H01L 51/50* (2006.01)
*H01L 51/52* (2006.01)
*G02F 1/13* (2006.01)
*G06F 1/16* (2006.01)
*G09F 9/30* (2006.01)
*G02F 1/1333* (2006.01)
*G02F 1/1335* (2006.01)

(52) U.S. Cl.
CPC .. *G02F 1/133305* (2013.01); *G02F 1/133331* (2021.01); *G02F 1/133334* (2021.01); *G02F 1/133528* (2013.01); *G06F 1/1641* (2013.01); *G06F 1/1652* (2013.01); *H01L 27/3246* (2013.01); *H01L 51/0097* (2013.01); *H01L 51/5056* (2013.01); *H01L 51/5072* (2013.01); *H01L 51/5088* (2013.01); *H01L 51/5092* (2013.01); *H01L 51/529* (2013.01); *H01L 51/5246* (2013.01); *H01L 51/5284* (2013.01); *H01L 51/5293* (2013.01); *H01L 2251/301* (2013.01); *H01L 2251/5338* (2013.01)

(58) Field of Classification Search
CPC ............... H01L 51/529; H01L 51/5237; H01L 51/5246; H01L 51/5293; H01L 51/5056; H01L 51/5072; H01L 51/5088; H01L 51/5092; H01L 2251/301; H01L 2251/5338; G02F 1/133331; G02F 1/133305; G02F 1/133334; G02F 1/133528; G02F 2001/133357; G06F 1/1641; G06F 1/1652; G06F 9/301
See application file for complete search history.

(56) References Cited

U.S. PATENT DOCUMENTS

| | | | |
|---|---|---|---|
| 10,481,423 B2 | 11/2019 | Song et al. | |
| 10,602,631 B2 | 3/2020 | Song et al. | |
| 11,188,164 B2* | 11/2021 | Eom | G06F 3/0412 |
| 11,455,014 B2* | 9/2022 | Kim | G06F 1/1652 |
| 2015/0177789 A1* | 6/2015 | Jinbo | G06F 1/3265 |
| | | | 313/511 |
| 2016/0165697 A1* | 6/2016 | Jang | G06F 3/041 |
| | | | 313/511 |
| 2017/0315589 A1* | 11/2017 | Isa | G06F 3/042 |
| 2018/0143482 A1* | 5/2018 | Jin | G06F 1/1643 |
| 2018/0348556 A1* | 12/2018 | Jin | G02F 1/133514 |
| 2019/0004360 A1* | 1/2019 | Aoki | H01L 51/0097 |
| 2019/0014669 A1* | 1/2019 | Ahn | H05K 5/0017 |
| 2019/0014671 A1* | 1/2019 | Ahn | H05K 1/028 |
| 2019/0165332 A1* | 5/2019 | Kwon | H01L 51/5056 |
| 2019/0361494 A1* | 11/2019 | Wu | G06F 1/1641 |
| 2020/0022261 A1* | 1/2020 | Choi | H05K 7/20445 |
| 2020/0043382 A1* | 2/2020 | Isa | G06F 3/044 |
| 2020/0120807 A1* | 4/2020 | Park | G06F 3/04164 |
| 2020/0227507 A1* | 7/2020 | Managaki | H01L 27/3276 |
| 2021/0408159 A1* | 12/2021 | Zhang | H01L 51/52 |

FOREIGN PATENT DOCUMENTS

| | | |
|---|---|---|
| KR | 10-1859456 B1 | 5/2018 |
| KR | 10-2018-0062195 A | 6/2018 |
| KR | 10-2018-0062249 A | 6/2018 |

* cited by examiner

DISPLAY APPARATUS INCLUDING MULTIPORTION SPACER

CROSS-REFERENCE TO RELATED APPLICATION

This application claims priority to and the benefit of Korean Patent Application No. 10-2020-0076766, filed on Jun. 23, 2020, in the Korean Intellectual Property Office (KIPO), the entire disclosure of which is incorporated by reference herein.

BACKGROUND

1. Field

One or more embodiments relate to display apparatuses, and more particularly, to display apparatuses in which the occurrence of defects may be reduced in a manufacturing process or a use process after manufacturing.

2. Description of Related Art

Among different display apparatuses, an organic light-emitting display apparatus has attracted attention as a next-generation display apparatus due to its wide viewing angle, excellent contrast, and fast response speed.

In general, in an organic light-emitting display apparatus, a thin-film transistor and organic light-emitting devices are formed on a substrate, and the organic light-emitting devices operate by emitting light autonomously. Such an organic light-emitting display apparatus is used as a display unit for small products such as mobile phones, or as a display unit for large products such as televisions.

In recent years, a flexible display apparatus that is easy to carry and can be applied to devices of various shapes has been in the spotlight as a next-generation display apparatus. In particular, research on flexible display apparatuses has been actively conducted based on organic light-emitting display technology.

SUMMARY

Aspects of one or more embodiments are directed towards a display apparatus in which the occurrence of defects may be reduced (e.g., significantly reduced) in a manufacturing process or a use process after manufacturing. However, this is only an example, and the scope of the present disclosure is not limited thereby.

Additional aspects will be set forth in part in the description which follows and, in part, will be apparent from the description, or may be learned by practice of the presented embodiments of the present disclosure.

One or more embodiments include a display apparatus including a bending area and a non-bending area, a display panel including a first panel area, a second panel area, and a panel bending portion that is bent such that at least the portion of a first panel area overlaps a portion of the second panel area, the display panel may have a curvature in the bending area, and a spacer between the first panel area and the second panel area, the spacer including a first portion in the bending area and a second portion in the non-bending area, wherein the first portion of the spacer is different in a material from the second portion, and wherein the first portion of the spacer may have a curvature in the bending area substantially equal to a curvature of the display panel in the bending area.

The first portion may be less than in hardness than the second portion.

The first portion may include a porous material.

The first portion may has greater adhesive force than the second portion.

The porous material comprises a pore filled with an adhesive.

The display apparatus may further include an integrated circuit (IC) chip on the second panel area of the display panel.

The spacer may further include a third portion located in the non-bending area and overlapping the IC chip, and the third portion may be different in material from the second portion.

The third portion may be less in hardness than the second portion.

The first portion may be less in hardness than the second portion.

The first portion and the third portion may be the same in material.

The first portion and the third portion may each include a porous material.

The first portion and the third portion may be at the same layer.

The display apparatus may further include a panel protective layer on a lower surface of the display panel, and the panel protective layer may have a curvature in the bending area substantially equal to the curvature of the display panel in the bending area.

The panel protective layer may include at least one of a light absorption layer to absorb light incident on the light absorption layer from the outside, a cushion layer to absorb an impact from the outside, or a heat dissipation layer to dissipate heat of the display panel.

The display apparatus may further include a cover window on an upper surface of the display panel, and the cover window may have a curvature in the bending area substantially equal to a curvature of the display panel in the bending area.

One or more embodiments include a display apparatus including a bending area and a non-bending area, a display panel including a first panel area, a second panel area, and a panel bending portion, the panel bending portion being between the first panel area and the second panel area and having a third panel area that is bent, wherein the display panel may have a curvature in the bending area, and a spacer between the first panel area and the second panel area, the spacer may have in the bending area a curvature in the bending area substantially equal to a curvature of the display panel in the bending area, and having at least one patterned portion, the at least one patterned portion of the spacer being different in material from an adjacent portion of the spacer adjacent to the at least one patterned portion.

The display apparatus may further include an integrated circuit (IC) chip on the second panel area of the display panel, wherein the at least one patterned portion of the spacer includes at least one of a first portion located in the bending area, a second portion located in the non-bending area or a third portion located in the non-bending area and overlapping the IC chip.

The first portion may be less in hardness than the adjacent portion of the spacer adjacent to the first portion, and the third portion may be less in hardness of the adjacent portion of the spacer adjacent to the third portion.

The first portion and the third portion may each include a porous material.

The first portion and the third portion may be at the same layer.

Other aspects, features, and advantages other than those described above will become apparent from the specific content, claims and drawings for carrying out the following embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
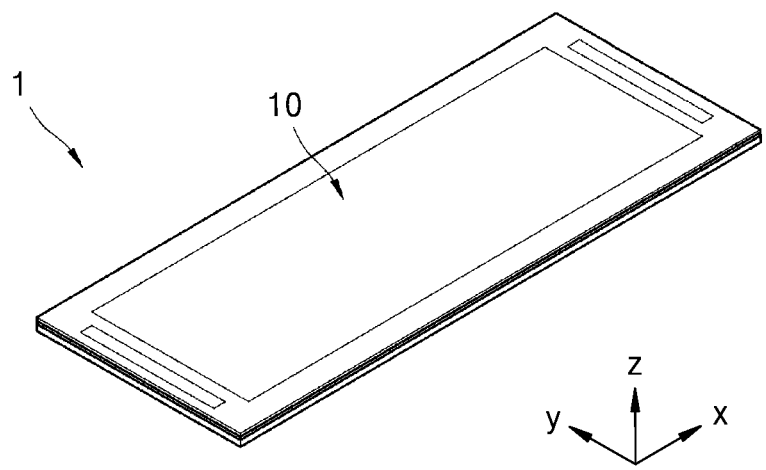
FIG. 1 is a perspective view schematically illustrating a portion of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described below in more detail with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations may be omitted.

In the following embodiments, terms such as "first" and "second" are not used in a limiting meaning, but are used for the purpose of distinguishing one component from another component.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Further, the use of "may" when describing embodiments of the present disclosure refers to "one or more embodiments of the present disclosure".

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, "A and/or B" refers to A, B, or A and B. Also, "at least one of A and B" represents the case of A, B, or A and B.

In the following embodiments, it will be understood that a layer, a region, or component is referred to as being "connected," it can be directly or indirectly connected. For example, intervening layers, regions, or components may be present. For example, in the specification, when a film, a region, a component, etc. are electrically connected, it may be directly electrically connected and/or indirectly electrically connected. For example, intervening films, regions, components, etc. may be present.

The x-axis, y-axis, and z-axis are not limited to three axes of the rectangular coordinate system, and may be interpreted in a broad sense. For example, the x-axis, the y-axis, and the z-axis may be perpendicular to one another, or may represent different directions that are not perpendicular to one another.

In the following embodiments, a first component "overlapping" a second component refers to the first component being positioned above or below the second component.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

In the specification, "upper" refers to a direction in which a cover window 20 (e.g., see FIG. 2) is arranged relative to a display panel 10 (e.g., see FIG. 1), that is, the +z direction, and "lower" refers to the −z direction.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the specification, to have "curvature" refers to curvature that is not zero (i.e., a non-zero curvature).

Hereinafter, embodiments will be described in more detail with reference to the accompanying drawings.

FIG. 1 is a perspective view schematically illustrating a portion of a display apparatus 1 according to an embodiment.

The display apparatus 1 according to an embodiment displays a moving picture or a still image, and may be used as a display screen of various suitable products such as portable electronic devices such as mobile phones, smart phones, tablet personal computers (PCs), mobile communication terminals, electronic notebooks, e-books, portable media players (PMPs), navigation devices, ultra-mobile PC (UMPC) devices, televisions, laptops, monitors, billboards, and/or Internet of Things (IoT) devices. In addition, the display apparatus 1 according to an embodiment may be used in a wearable device such as a smart watch, a watch phone, a glasses-type display, and/or a head-mounted display (HMD). In addition, the display apparatus 1 according to an embodiment may be used as an instrument panel of a vehicle, a center information display (CID) arranged on a center fascia or dashboard of a vehicle, a room mirror display that replaces a side mirror of a vehicle, and/or a display arranged on the rear side of a front seat as an entertainment for the rear seats of a vehicle.

The display apparatus 1 may be formed in a rectangular shape on a plane or in a plan view. For example, the display apparatus 1 may have a rectangular planar shape having a long side in a first direction (e.g., the x direction) and a short side in a second direction (e.g., the y direction) as shown in FIG. 1. A corner where the long side in the first direction (e.g., the x direction) meets the short side in the second direction (e.g., the y direction) may be rounded to have a certain curvature or may be formed at a right angle. The planar shape of the display apparatus 1 is not limited to a rectangle, and may be any suitable shape. For example, the planar shape of the display apparatus 1 may be formed in other polygonal, elliptical, or irregular shapes.

As shown in FIG. 1, the display apparatus 1 according to an embodiment includes a display panel 10.

The display panel 10 may be a light-emitting display panel including a light-emitting element. For example, the display panel 10 may be an organic light-emitting display panel using an organic light-emitting diode including an organic emission layer, a micro light-emitting diode display panel using a microLED, a quantum dot emission layer using a quantum dot light-emitting diode including a quantum dot emission layer, or an inorganic light-emitting display panel using an inorganic light-emitting device including an inorganic semiconductor.

The display panel 10 may be a flexible display panel having flexibility such that the display panel 10 is bendable, foldable, stretchable, or rollable (e.g., easily bendable, foldable, stretchable, or rollable). For example, the display panel 10 may be a foldable display panel that can be folded and unfolded, a curved display panel with a curved display surface, a bended display panel in which one or more areas other than the display surface is bent, a rollable display panel that can be rolled and unrolled, and a stretchable display panel that can be stretched.

Figure 2:
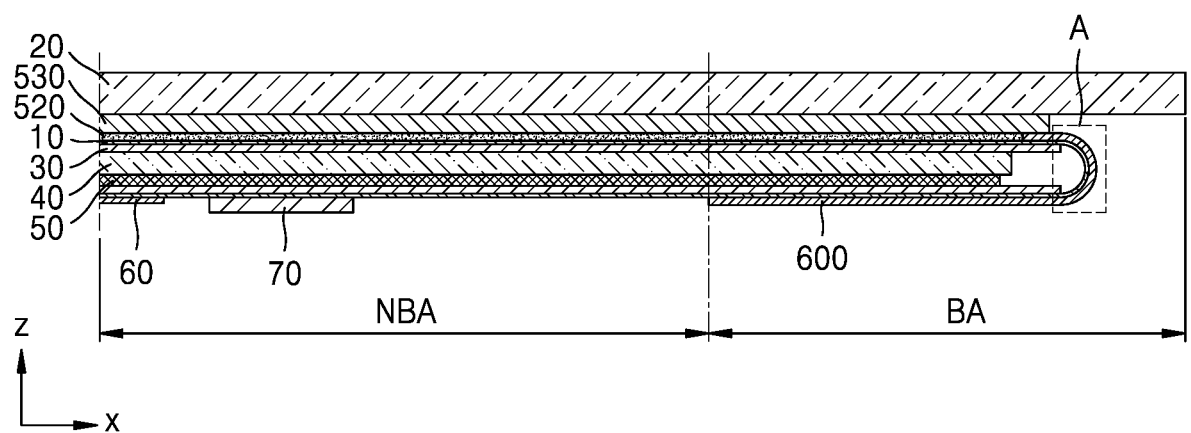
FIG. 2 is a cross-sectional view schematically illustrating a portion of the display apparatus of FIG. 1.

FIG. 2 is a cross-sectional view schematically illustrating a portion of the display apparatus of FIG. 1.

The display apparatus 1 according to an embodiment includes a bending area BA and a non-bending area NBA. The bending area BA refers to an area that may be bent (i.e., is bendable) to have a curvature (e.g., a portion of the display apparatus 1 in the bending area BA may be bent such that the portion of the display apparatus 1 is curved (i.e., has a curvature)), and the non-bending area NBA refers to an area other than the bending area BA, which is not bendable (e.g., a portion of the display apparatus 1 in the non-bending area NBA may not be bendable). In one or more embodiments, the portion of the display apparatus 1 in the non-bending area NBA is flat.

In FIG. 2, the display apparatus 1 is not bent in the bending area BA and is flat. In other words, the display apparatus 1 of FIG. 2 is in a state where the portion of the display apparatus 1 in the bending area BA is not bent. However, components provided in the display apparatus 1 in the bending area BA may be bent to have a curvature. For example, the display panel 10 may be bent in the bending area BA and have a curvature at a portion positioned in the bending area BA, and a cover window 20, a protective film 30, a panel protective layer 40, and a spacer 50 may have, in the bending area BA, a curvature equal to or substantially equal to the curvature of the display panel 10 in the bending area BA.

As shown in FIG. 2, the display apparatus 1 according to an embodiment may include the display panel 10, the cover window 20, the protective film 30, the panel protective layer 40, the spacer 50, a circuit board 60, an integrated circuit (IC) chip 70, a polarizing plate 520, and a panel bending protective layer 600.

Figure 3:
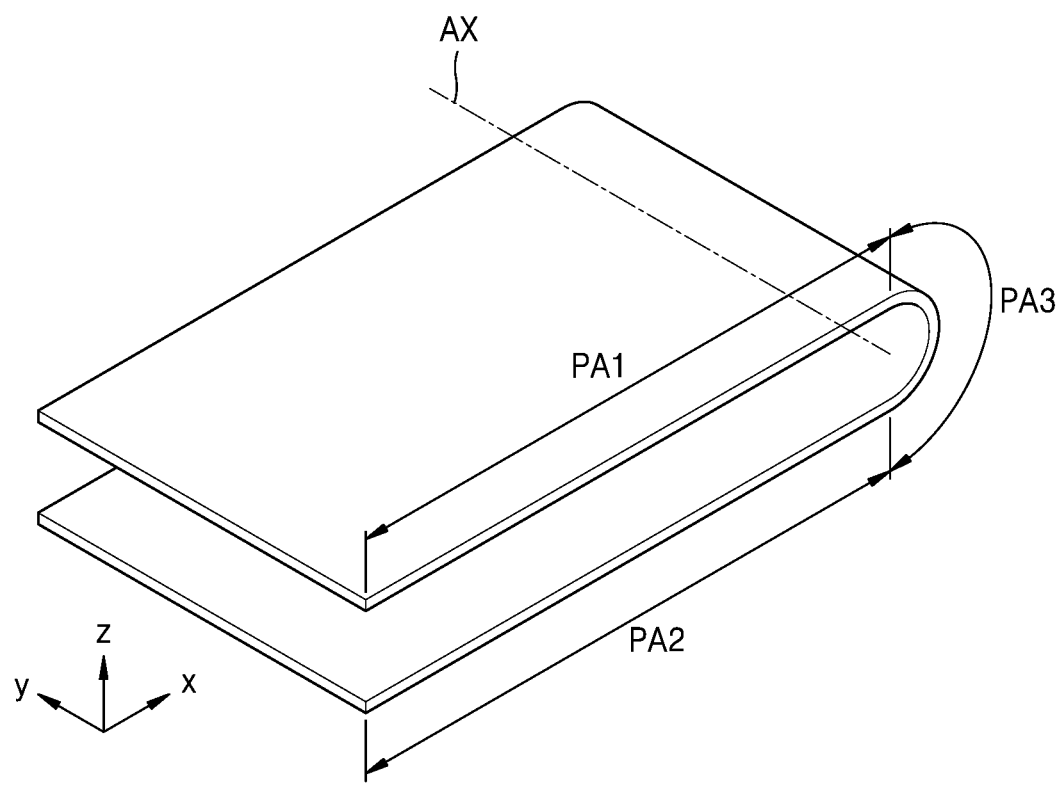
FIG. 3 is a perspective view schematically illustrating a portion of part A of FIG. 2.

The display panel 10 may include a first panel area PA1, a second panel area PA2, and a panel bending portion A that is bent such that at least a portion of the first panel area PA1 (e.g., see FIG. 3) overlaps (e.g., overlaps in the z direction) the second panel area PA2 (e.g., see FIG. 3). In this case, the panel bending portion A of the display panel 10 may be located in the bending area BA. For example, the display panel 10 extends from the non-bending area NBA in the direction of the bending area BA, is bendable in the bending area BA and extends in the bending area BA toward the panel bending portion A, extends to form the panel bending portion A, and extends back toward the non-bending area NBA from the panel bending portion A in the bending area BA.

The cover window 20 may be above the display panel 10 to cover the upper surface of the display panel 10. The cover window 20 may function to protect the upper surface of the display panel 10.

In an embodiment, the cover window 20 may include a transmission cover portion corresponding to the display panel 10 and a light shielding cover portion corresponding to an area other than the display panel 10. In this case, the transmission cover portion may include a transparent material that transmits light, and the light shielding cover portion may include an opaque material that blocks light.

The protective film 30 may be located on the lower surface of the display panel 10. For example, the protective film 30 may overlap (e.g., overlap in the z direction) the display panel 10 and be at an underside of a portion of the display panel 10. The protective film 30 may serve as a lower protective film protecting the lower surface of the display panel 10, that is, the lower surface of a substrate 100 (e.g., see FIG. 4) provided by the display panel 10. In addition, the protective film 30 may serve to support the substrate 100 in addition to protecting the lower surface of the substrate 100. The protective film 30 may include polyethylene terephthalate (PET) or polyimide (PI).

In an embodiment, the protective film 30 may include a protective film base 31 (e.g., see FIG. 5) and a protective film adhesive layer 32 (e.g., see FIG. 5) between the substrate 100 (e.g., see FIG. 5) and the protective film base.

The panel protective layer 40 may be located on the lower surface of the display panel 10. The panel protective layer 40 may be attached to the lower surface of the display panel 10 by using an adhesive member. In this case, the adhesive member may be a pressure-sensitive adhesive (PSA). However, the present disclosure is not limited thereto, and in other embodiments, any suitable adhesive or attachment mechanism may be used.

In an embodiment, the panel protective layer 40 may include at least one of a light absorption layer for absorbing light incident from the outside, a cushion layer for absorbing shock from the outside, or a heat dissipation layer for efficiently dissipating heat of the display panel 10.

The light absorption layer may be placed under the display panel 10. The light absorption layer blocks the transmission of light, thereby preventing or substantially preventing elements arranged under the light absorbing member, for example, the circuit board 60, or the like from being visually recognized (e.g., visible) from the upper portion of the display panel 10. The light absorption layer may include a light absorbing material such as black pigment or black dye.

The cushion layer may be under the light absorbing member. The cushion layer absorbs external shocks, thereby preventing or substantially preventing the display panel 10 from being damaged. The cushion layer may include a single layer or multiple layers. For example, the cushion layer is formed of polymer resin such as polyurethane, polycarbonate, polypropylene, polyethylene, and the like or may include a material having elasticity such as rubber, urethane-based material, or a sponge generated by foam-molding acrylic material.

The heat dissipation layer may be under the cushion layer. The heat dissipation layer may include a first heat dissipation layer including graphite or carbon nanotubes and a second heat dissipation layer formed of a metal thin film such as copper, nickel, ferrite, and silver that is capable of shielding electromagnetic waves and has excellent thermal conductivity.

The spacer 50 may be between a first panel area PA1 (e.g., see FIG. 3) and a second panel area PA2 (e.g., see FIG. 3) of the display panel 10. The spacer 50 may serve as a tape that allows layers positioned between overlapping parts of the bent display panel 10 to be in contact (e.g., close contact) with each other when the display panel 10 is bent. In addition, the spacer 50 may serve to secure sufficient space between the overlapping parts of bent display panel 10. For example, the spacer 50 may have a height (e.g., a height in the z direction) such that sufficient space is provided between the overlapping parts of the bent display panel 10.

The spacer 50 may include PET, but the present disclosure not limited thereto. In addition, the spacer 50 may include a portion including a material different from that of the adjacent portions, and a detailed description thereof will be described below in more detail with reference to FIGS. 6-9.

The circuit board 60 may be attached to one end of display panel 10. For example, the circuit board 60 may be located on one end of the second panel area PA2 (e.g., see FIG. 3). The circuit board 60 is a flexible printed circuit board (FPCB) that can be bent, a rigid printed circuit board (PCB) that is rigid and is not easily bendable, or a composite PCB including both the FPCB and the rigid PCB.

The IC chip 70 may be located on the second panel area PA2 (e.g., see FIG. 3) of the display panel 10. For example, the IC chip 70 may be a display driver that receives control signals and power voltages and generates and outputs signals and voltages for driving the display panel 10.

The polarizing plate 520 may be located in the upper portion of the display panel 10. The polarizing plate 520 may be positioned on the display panel 10 by using a first light-transmitting adhesive 510 (e.g., see FIG. 4). At this time, the first light-transmitting adhesive 510 may be an optically clear adhesive (OCA), but the present disclosure is not limited thereto. This polarizing plate 520 may serve to improve visibility by reducing reflection of external light. However, the display apparatus 1 according to the present embodiment does not always include the polarizing plate 520, and the polarizing plate 520 may be omitted or replaced with other configurations as desired. For example, the polarizing plate 520 may be omitted, and external light reflection may be reduced by using a black matrix and a color filter. In one or more embodiments, the polarizing plate 520 may be adhered to the cover window 20 by using a second light-transmitting adhesive 530 arranged on the polarizing plate 520. The second light-transmitting adhesive 530 may be between the polarizing plate 520 and the cover window 20.

The panel bending protective layer 600 may be located by covering the outer curved surface of the panel bending portion A. That is, the panel bending protective layer 600 may be positioned to cover at least the outer curved surface of a third panel area PA3 (e.g., see FIG. 3) of the display panel 10. In one or more embodiments, the panel bending protective layer 600 may extend from the panel bending portion A to an interface of the bending area BA and the non-bending area NBA as shown in FIG. 2.

When bending a laminate, a stress neutral plane exists within the laminate. When the panel bending protective layer 600 is not present, excessive tensile stress may be applied to a first conductive layer 215c (e.g., see FIG. 5) within the bending area BA due to bending of the substrate 100 (e.g., see FIG. 5) and the like. This is because the position of the first conductive layer 215c may not correspond to the stress neutral plane. However, by making the panel bending protective layer 600 present (i.e., providing the protecting layer 600) and adjusting its thickness and modulus, it is possible to adjust the position of the stress neutral plane in the laminate including all of the substrate 100, the first conductive layer 215c, and the panel bending protective layer 600. Therefore, by placing the stress neutral plane near or above the first conductive layer 215c through the panel bending protective layer 600, the tensile stress applied to the first conductive layer 215c can be reduced (e.g., significantly reduced), or the compressive stress can be applied to the first conductive layer 215c. This panel bending protective layer 600 may be formed of acryl or the like.

For reference, when compressive stress is applied to the first conductive layer 215c, the probability that the first conductive layer 215c is thereby damaged is extremely low compared to when tensile stress is applied.

For reference, the panel bending protective layer 600 is shown as being flat in FIG. 2, but the present disclosure is not limited thereto. For example, when a liquid or paste type material is applied and hardened to form the panel bending protective layer 600, the volume of the panel bending protective layer 600 may decrease during the hardening process, and thus, some portions of the panel bending protective layer 600 may be formed thicker than other portions of the panel bending protective layer 600. Accordingly, the panel bending protective layer 600 may have an uneven outer surface.

Figure 4:
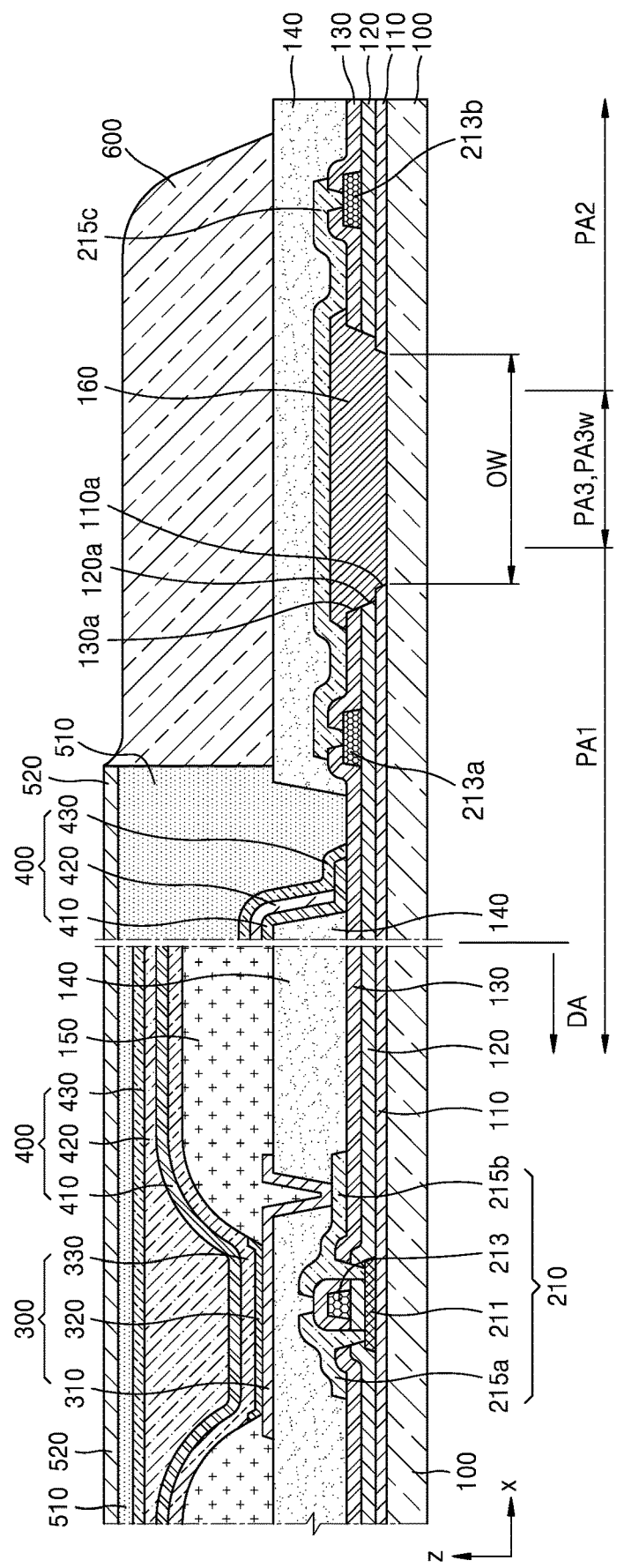
FIGS. 4 and 5 are cross-sectional views schematically illustrating an enlarged view of a portion of part A of FIG. 2.
Figure 5:
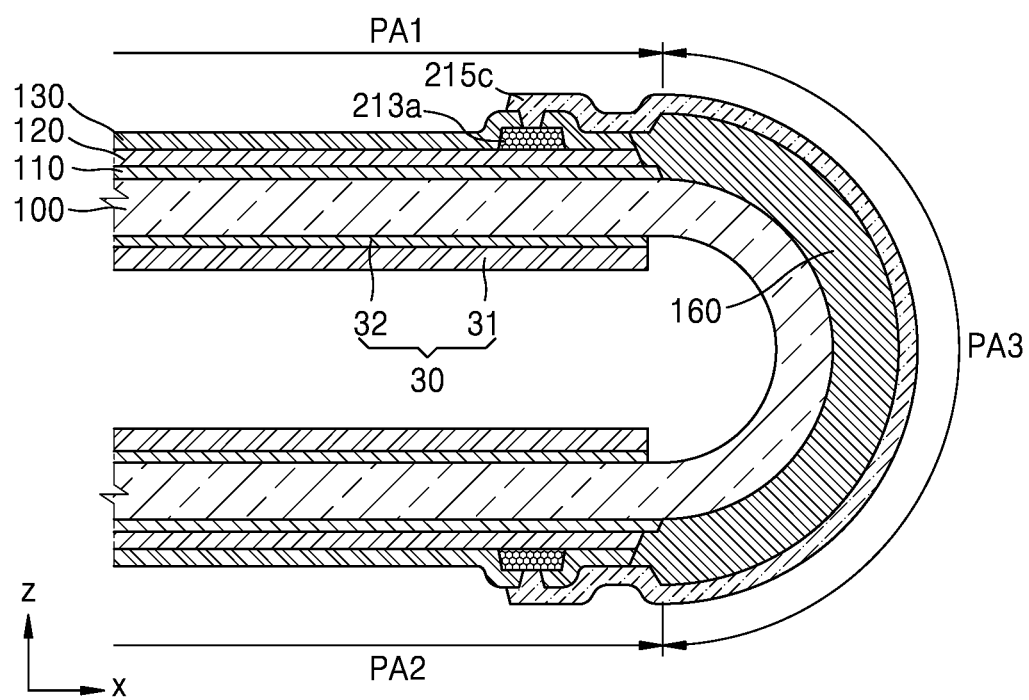

FIG. 3 is a perspective view schematically illustrating a portion of part A of FIG. 2, and FIGS. 4 and 5 are cross-sectional views schematically illustrating portions of part A of FIG. 2.

As shown in FIGS. 3-5, the substrate 100 included in the display panel 10 according to the present embodiment includes the third panel area PA3 extending in a first direction (+y direction). This third panel area PA3 is located between the first panel area PA1 and the second panel area PA2 in a second direction (+x direction) crossing the first direction. In addition, the substrate 100 is bent around a bending axis AX (e.g., see FIG. 3) extending in the first direction (+y direction). The substrate 100 may include various suitable materials having flexible or bendable properties, and for example, may include polymer resin such as polyethersulphone (PES), polyacrylate, polyetherimide (PEI), polyethylene naphthalate (PEN), PET, polyphenylene sulfide (PPS), polyarylate (PAR), PI, polycarbonate (PC), and/or cellulose acetate propionate (CAP). However, the substrate 100 may be modified in various suitable ways, for example, to include a multilayer structure including two layers each including such a polymer resin and a barrier layer including inorganic materials (such as silicon oxide, silicon nitride, silicon oxynitride, and the like) between the two layers.

The first panel area PA1 includes a display area DA. In one or more embodiments, the first panel area PA1 may include a portion of a non-display area outside the display area DA in addition to the display area DA as shown in FIG. 4. The second panel area PA2 also includes the non-display area.

In addition to a display device 300, a thin-film transistor 210 to which the display device 300 is connected (e.g., electrically connected) may be located in the display area DA of the substrate 100 as shown in FIG. 4. In FIG. 4, the display device 300 located in the display area DA is an organic light-emitting device. That the organic light-emitting device is connected (e.g., electrically connected) to the thin-film transistor 210 can be understood as a pixel electrode 310 being connected (e.g., electrically connected) to the thin-film transistor 210.

The thin-film transistor 210 may include a semiconductor layer 211 including amorphous silicon, polycrystalline silicon, or an organic semiconductor material, a gate electrode 213, a source electrode 215a, and a drain electrode 215b. In order to secure the insulation between the semiconductor layer 211 and the gate electrode 213, a gate insulating film 120 including an inorganic material such as silicon oxide, silicon nitride, and/or silicon oxynitride may be formed between the semiconductor layer 211 and the gate electrode 213. In addition, an interlayer insulating film 130 including an inorganic material such as silicon oxide, silicon nitride, and/or silicon oxynitride may be above the gate electrode 213, and the source electrode 215a and the drain electrode 215b may be above that interlayer insulating film 130. In this way, an insulating film including an inorganic material may be formed through chemical vapor deposition (CVD) or atomic layer deposition (ALD). This is also the same in the following embodiments and variations thereof. However, the present disclosure is not limited thereto. For example, any suitable process may be used to form the structure described above.

A buffer layer 110 including an inorganic material such as silicon oxide, silicon nitride, and/or silicon oxynitride may be between the thin-film transistor 210 and the substrate 100 having the structure described above. The buffer layer 110 may serve to improve the smoothness of the upper surface of the substrate 100 or to prevent or reduce (e.g., significantly reduce) the penetration of impurities into the semiconductor layer 211 of the thin-film transistor 210.

In addition, a planarization layer 140 may be above the thin-film transistor 210. For example, as shown in FIG. 4, when an organic light-emitting device is arranged above the thin-film transistor 210, the planarization layer 140 may serve to planarize or substantially planarize the upper portion of the protective layer covering the thin-film transistor 210. The planarization layer 140 may be formed of an organic material such as acryl, benzocyclobutene (BCB), or hexamethyldisiloxane (HMDSO). In FIG. 4, the planarization layer 140 is shown as a single layer, but various suitable modifications are possible. For example, the planarization layer 140 may be a multilayer structure. In addition, as shown in FIG. 4, the planarization layer 140 may have an opening outside the display area DA such that a portion of the planarization layer 140 of the display area DA and a portion of the planarization layer 140 of the second panel area PA2 are physically separated or spaced from each other. This is to prevent or substantially prevent impurities or the like that have penetrated from the outside from reaching the inside of the display area DA via the inside of the planarization layer 140 (e.g., movement of impurities from the portion of the planarization layer 140 of the second panel area PA2 to the portion of the planarization layer 140 of the display area DA).

In the display area DA of the substrate 100, the display device 300 may be above the planarization layer 140. The display device 300 may be, for example, an organic light-emitting device including the pixel electrode 310, an opposite electrode 330, and an intermediate layer 320 located therebetween and including an emission layer. The pixel electrode 310 is connected (e.g., electrically connected) to the thin-film transistor 210 by contacting any of the source electrode 215a and the drain electrode 215b via an opening formed in the planarization layer 140 as shown in FIG. 4.

A pixel defining layer 150 may be above the planarization layer 140. The pixel defining layer 150 serves to define a pixel by having an opening corresponding to each subpixel, that is, an opening that exposes at least the central portion of the pixel electrode 310. In addition, in FIG. 4, the pixel defining layer 150 increases the distance between the edge of the pixel electrode 310 and the opposite electrode 330 above the pixel electrode 310, thereby preventing or substantially preventing arcs from occurring on or at the edge of the pixel electrode 310. The pixel defining layer 150 may be formed of an organic material such as PI and/or HMDSO.

The intermediate layer 320 of the organic light-emitting device may include a low molecular weight material or a high molecular weight material. When the intermediate layer 320 includes a low molecular weight material, the intermediate layer 320 may have a structure with a hole injection layer (HIL), a hole transport layer (HTL), an emission layer (EML), an electron transport layer (ETL), and an electron injection layer (EIL), and the like stacked in a single or composite structure, and may be formed by vacuum deposition. When the intermediate layer 320 includes a high molecular weight material, the intermediate layer 320 may have a structure including an HTL and an EML. In this case, the HTL may include poly(3,4-ethylenedioxythiophene) (PEDOT), and the EML may include a polymer material such as polyphenylene vinylene (PPV) and polyfluorene.

This intermediate layer 320 may be formed by screen printing, inkjet printing, laser induced thermal imaging (LITI), or the like. However, the intermediate layer 320 is not necessarily limited thereto, and may have various suitable structures. In addition, the intermediate layer 320 may include an integral layer over a plurality of pixel electrodes 310, or may include layers that are patterned to correspond to the plurality of pixel electrodes 310, respectively.

The opposite electrode 330 is arranged at an upper portion of the display area DA to cover the display area DA as shown in FIG. 4. That is, the opposite electrode 330 may be integrally formed in a plurality of organic light-emitting devices to correspond to the plurality of pixel electrodes 310.

Because this organic light-emitting device can be damaged (e.g., easily damaged) by moisture or oxygen from the outside, an encapsulation layer 400 may cover and protect the organic light-emitting device. The encapsulation layer 400 covers the display area DA and may extend outside the display area DA. This encapsulation layer 400 may include a first inorganic encapsulation layer 410, an organic encapsulation layer 420, and a second inorganic encapsulation layer 430 as shown in FIG. 4.

The first inorganic encapsulation layer 410 covers the opposite electrode 330, and may include silicon oxide, silicon nitride, and/or silicon oxynitride. However, other layers such as a capping layer may be arranged between the first inorganic encapsulation layer 410 and the opposite electrode 330 as desired. Because the first inorganic encapsulation layer 410 is formed along the structure below the first inorganic encapsulation layer 410, the upper surface of the first inorganic encapsulation layer 410 may not be flat as shown in FIG. 4.

The organic encapsulation layer 420 covers this first inorganic encapsulation layer 410, but unlike the first inorganic encapsulation layer 410, may have a flat upper surface. For example, the organic encapsulation layer 420 may have a substantially flat upper surface in a portion thereof corresponding to the display area DA. The organic encapsulation layer 420 may include one or more materials selected from the group consisting of PET, PEN, PC, PI, polyethylene sulfonate, polyoxymethylene, PAR, and HMDSO.

The second inorganic encapsulation layer 430 covers the organic encapsulation layer 420 and may include silicon oxide, silicon nitride, and/or silicon oxynitride. This second inorganic encapsulation layer 430 may prevent or substantially prevent the organic encapsulation layer 420 from being exposed outside by contacting the first inorganic encapsulation layer 410 at an edge thereof located outside the display area DA.

The encapsulation layer 400 includes the first inorganic encapsulation layer 410, the organic encapsulation layer 420, and the second inorganic encapsulation layer 430 as described above. Thus, even when cracks occur in the multilayer structure of the encapsulation layer 400, such cracks may be prevented or substantially prevented from being connected in between the first inorganic encapsulation layer 410 and the organic encapsulation layer 420 or between the organic encapsulation layer 420 and the second inorganic encapsulation layer 430. Accordingly, it is possible to prevent or reduce (e.g., significantly reduce) the formation of a path (e.g., a path formed by cracks) through which external moisture or oxygen penetrates through the display area DA.

The polarizing plate 520 may be located on the encapsulation layer 400 by using the first light-transmitting adhesive 510.

Meanwhile, the buffer layer 110, the gate insulating film 120, and the interlayer insulating film 130 including inorganic materials may be collectively referred to as an inorganic insulating layer. The inorganic insulating layer has an opening corresponding to the third panel area PA3 as shown in FIG. 4. That is, the buffer layer 110, the gate insulating film 120, and the interlayer insulating film 130 may have openings 110a, 120a, and 130a corresponding to the third panel area PA3, respectively. That such an opening corresponds to the third panel area PA3 can be understood that the openings overlap the third panel area PA3.

At this time, an area of the opening may be greater than an area of the third panel area PA3. To this end, in FIG. 4, a width OW of the opening is shown to be greater than a width PA3$w$ of the third panel area PA3. For reference, it may be understood in FIG. 4 that the width OW of the opening or the width PA3$w$ of the third panel area PA3 are enlarged or reduced in size for convenience of illustration. Here, the area of the opening may be defined as an area of the narrowest opening from among the openings 110a, 120a, and 130a of the buffer layer 110, the gate insulating film 120, and the interlayer insulating film 130, and FIG. 4 shows that the area of the opening is defined by the area of the opening 110a of the buffer layer 110.

For reference, after the opening 110a is formed in the buffer layer 110, the opening 120a of the gate insulating film 120 and the opening 130a of the interlayer insulating film 130 may be formed at the same time. When forming the thin-film transistor 210, contact holes penetrating through the gate insulating film 120 and the interlayer insulating film 130 must be formed so that the source electrode 215a and the drain electrode 215b contact the semiconductor layer 211. Thus, when forming these contact holes, the opening 120a of the gate insulating film 120 and the opening 130a of the interlayer insulating film 130 may be concurrently (e.g., simultaneously) formed. Accordingly, the inner surface of the opening 120a of the gate insulating film 120 and the inner surface of the opening 130a of the interlayer insulating film 130 may form a continuous or substantially continuous surface as shown in FIG. 4.

The display panel 10 according to the present embodiment includes an organic material layer 160 that fills at least a portion of the opening of the inorganic insulating layer (e.g., the openings of the buffer layer 110, the gate insulating film 120, and the interlayer insulating film 130). FIG. 4 shows that the organic material layer 160 fills all of the opening 110a of the buffer layer 110, the opening 120a of the gate insulating film 120, and the opening 130a of the interlayer insulating film 130. In addition, the display panel 10 according to the present embodiment includes the first conductive layer 215c, which extends from the first panel area PA1 to the second panel area PA2 via the third panel area PA3 and is above the organic material layer 160. However, where the organic material layer 160 is not present, the first conductive layer 215c may be located on an inorganic insulating layer such as the interlayer insulating film 130. This first conductive layer 215c may be concurrently (e.g., simultaneously) formed of the same material as a material of the source electrode 215a or the drain electrode 215b.

FIG. 4 shows that the panel bending portion A of the display panel 10 is not bent, for convenience, but in the display panel 10 according to the present embodiment, the substrate 100 and the like are actually bent in the third panel area PA3 as shown in FIGS. 3 and 5. To this end, during the manufacturing process, the display apparatus 1 is manufactured while the substrate 100 is approximately flat as shown in FIG. 4, and then, the substrate 100, and the like are bent in the third panel area PA3 such that the display panel 10 substantially has a shape as shown in FIG. 3. At this time, tensile stress may be applied to the first conductive layer 215c while the substrate 100, and the like are in the process of bending in the third panel area PA3. However, in the display panel 10 according to the present embodiment, defects occurring in the first conductive layer 215c during such bending can be prevented or reduced (e.g., significantly reduced).

When an inorganic insulating layer such as the buffer layer 110, the gate insulating film 120, and/or the interlayer insulating film 130 does not have an opening in the third panel area PA3, and thus has a continuous or substantially continuous shape from the first panel area PA1 to the second panel area PA2, and the first conductive layer 215c is located on such an inorganic insulating layer, a large or high tensile stress is applied to the first conductive layer 215c during bending of the substrate 100 and the like. In particular, because the hardness of the inorganic insulating layer is greater than that of the organic material layer, the probability of cracks occurring in the inorganic insulating layer in the third panel area PA3 is very high. Thus, when cracks occur in the inorganic insulating layer, cracks or the like may also occur in the first conductive layer 215c on the inorganic insulating layer. As a result, the probability of the occurrence of defects such as a short circuit of the first conductive layer 215c increases (e.g., increases remarkably).

However, in the display panel 10 according to the present embodiment, the inorganic insulating layer has an opening in the third panel area PA3 as described above, and a portion of the first conductive layer 215c located in the third panel area PA3 is above the organic material layer 160 that fills at least a portion of the opening of the inorganic insulating layer. The inorganic insulating layer has an opening in the third panel area PA3, and thus, the probability of occurrence of cracks in the inorganic insulating layer is low (e.g. extremely low), and in the organic material layer 160, the probability of occurrence of cracks in the organic material layer 160 is low due to the nature of an organic material. Therefore, the occurrence of cracks in the third panel area PA3 of the first conductive layer 215c on the organic material layer 160 can be prevented or the probability of occurrence of cracks can be reduced (e.g., significantly reduced). Further, because the hardness of the organic material layer 160 is less than the hardness of the inorganic material layer, the organic material layer 160 may absorb tensile stress generated by bending of the substrate 100 and the like, and effectively reduce the concentration of tensile stress on the first conductive layer 215c.

The display panel 10 according to the present embodiment may include second conductive layers 213a and 213b in addition to the first conductive layer 215c. The second conductive layers 213a and 213b are arranged in the first panel area PA1 or the second panel area PA2 to be located in a different layer from the first conductive layer 215c, and may be connected (e.g., electrically connected) to the first conductive layer 215c. In FIG. 4, the second conductive layers 213a and 213b are of the same material on the same layer as the gate electrode 213 of the thin-film transistor 210, that is, the gate insulating film 120. In addition, in FIG. 4, the first conductive layer 215c contacts the second conductive layers 213a and 213b via contact holes formed in the interlayer insulating film 130. In addition, in FIG. 4, the second conductive layer 213a is located in the first panel area PA1, and the second conductive layer 213b is located in the second panel area PA2.

The conductive layer 213a in the first panel area PA1 may be connected (e.g., electrically connected) to the thin-film transistor in the display area DA, and thus, the first conductive layer 215c may be connected (e.g., electrically connected) to the thin-film transistor in the display area DA through the conductive layer 213a. In one or more embodiments, the second conductive layer 213b located in the second panel area PA2 may also be connected (e.g., electrically connected) to the thin-film transistor in the display area DA by using the first conductive layer 215c. As described above, the second conductive layers 213a and 213b, while being outside the display area DA, may be connected (e.g., electrically connected) to the components in the display area DA, or, while being outside the display area DA, may extend in the direction of the display area DA and be partially located in the display area DA.

Figure 6:
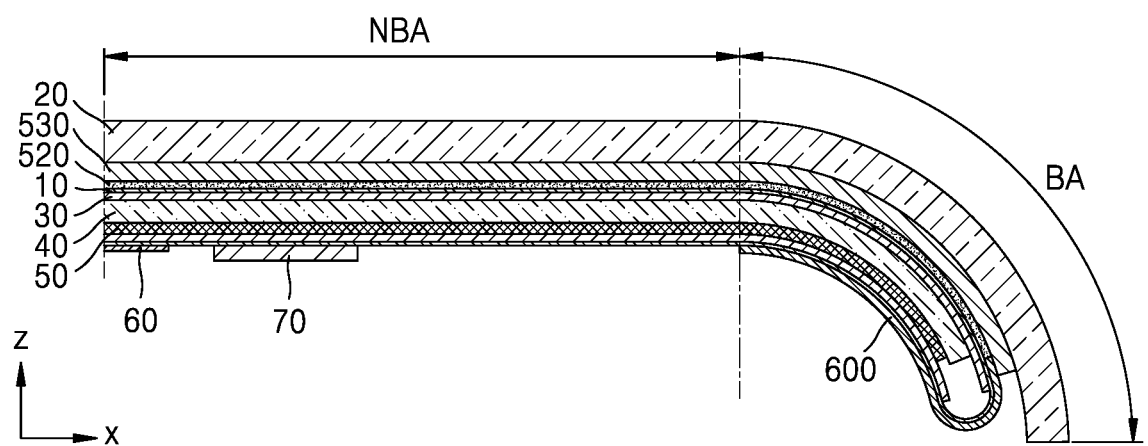
FIG. 6 is a cross-sectional view schematically illustrating a portion of the display apparatus according to another embodiment.

FIG. 6 is a cross-sectional view schematically illustrating a portion of the display apparatus 1 according to another embodiment.

As shown in FIG. 6, the display apparatus 1 according to the present embodiment may be bent in the bending area BA and have a curvature. For example, the display panel 10, the cover window 20, the protective film 30, the panel protective layer 40, and the spacer 50 may be bent in the bending area BA, and a portion thereof located in the bending area BA may have a curvature. In addition, the cover window 20, the protective film 30, the panel protective layer 40, and the spacer 50 may have, in the bending area BA, a curvature equal to or substantially equal to a curvature of the display panel 10 in the bending area BA.

Figure 7:
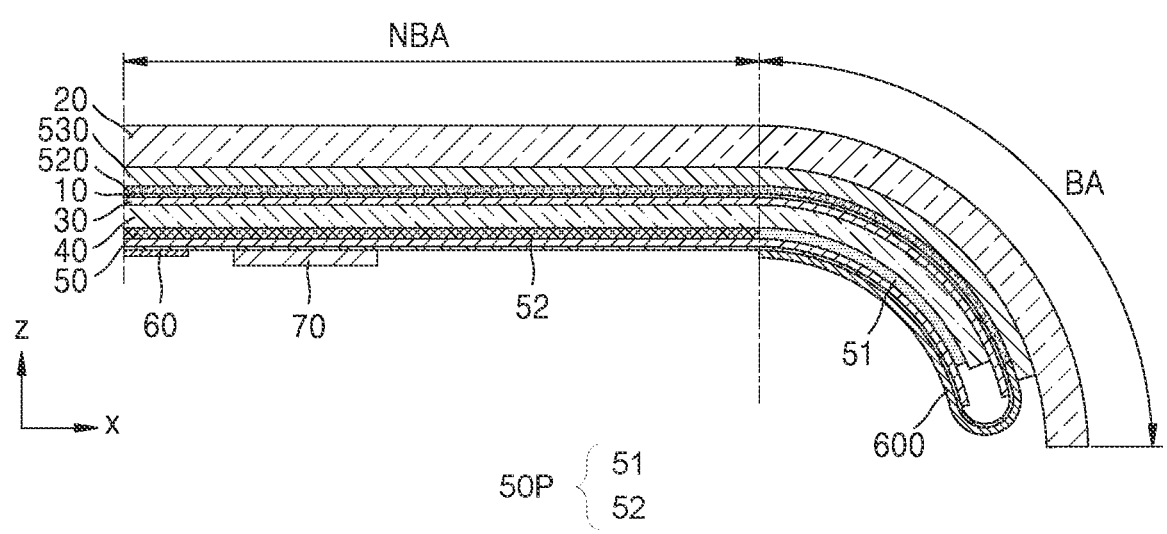
FIG. 7 is a cross-sectional view schematically illustrating a portion of the display apparatus according to another embodiment.

FIG. 7 is a cross-sectional view schematically illustrating a portion of the display apparatus 1 according to another embodiment.

As the display apparatus 1 is bent in the bending area BA, tensile stress or compressive stress is applied to the components in the bending area BA, which may cause defects in the components located in the bending area BA during the manufacturing process or in the use process after manufacturing. For example, when the hardness of the layers located in the bending area BA is large or high, breaking or cracks may occur during the bending process or in a bent state, and thus, a defect may be caused. In addition, when the adhesive strength between the layers in the bending area BA is not sufficient, the layers may not remain adhered in the process of bending or in the bent state, and thus, defects such as lifting may occur.

To this end, in embodiments to be described in more detail below, the spacer 50 may include at least one patterned portion 50P including a material different from a material of a portion of the spacer 50 adjacent thereto. That is, certain portions of the spacer 50 may be patterned, and the patterned portions 50P may be formed to include a differentiated material (e.g., a material different from other portions of the spacer 50). Meanwhile, an inkjet process or the like may be used to form the patterned portion 50P with a differentiated material, but the present disclosure is not limited thereto.

As shown in FIG. 7, the display apparatus 1 according to the present embodiment may include the spacer 50 including a differentiated material at a portion thereof positioned in the bending area BA.

For example, the spacer 50 may include a first portion 51 in the bending area BA and a second portion 52 in the non-bending area NBA. According to the present embodiment, the spacer 50 is made of different materials in each of the bending area BA and the non-bending area NBA, and thereby, defects that may occur in the bending area BA can be prevented or reduced. The patterned portion 50P may be the first portion 51 or the second portion 52.

At this time, the first portion 51 located in the bending area BA has the same curvature as the display panel 10 in the bending area BA and is bent, and includes a material different from a material of the second portion 52 in the non-bending area NBA. For example, the hardness of the material included in the first portion 51 may be less than that of the material included in a portion adjacent to the first portion 51 (e.g., the second portion 52). Therefore, the hardness of the first portion 51 of the spacer 50 may be less than that of a portion adjacent thereto.

The first portion 51 may include porous material(s) such as foam(s). A porous material is a material containing a large or high number of fine-sized pores inside. The porous material(s) included in the first portion 51 may be classified into macropores (with diameters of 50 nm or more), mesopores (with diameters of 2 to 50 nm), micropores (with diameters of 1 to 2 nm), or nanopores (with diameters less than 1 nm) according to the size of the pores contained therein, but are not limited thereto.

For example, a porous material may be a macroporous material, which may be various suitable substances such as polymers, ceramics, metals, and carbon materials that are manufactured by a process of removing emulsion, foam, and polymer latex particles by using them as a template. In addition, the porous material may be a mesoporous material, which may be a substance manufactured by a process of using a surfactant or block copolymer as a mold for the synthesis of the mesoporous material, mixing base material with a metal oxide or a precursor of a metal material, and then removing the template. Further, the porous material may be a microporous material, and may be a molecular sieve such as zeolite.

In addition, as an example, the adhesive force of the first portion 51 of the spacer 50 may be greater than the adhesive force of the second portion 52 of the spacer 50. To this end, the pores of the porous material included in the first portion 51 may be filled with an adhesive. According to the present embodiment, the spacer 50 has a greater adhesive force in the bending area BA, and thus is more firmly adhered to the neighboring layers, and thereby, defects such as lifting can be more efficiently prevented or reduced.

Figure 8:
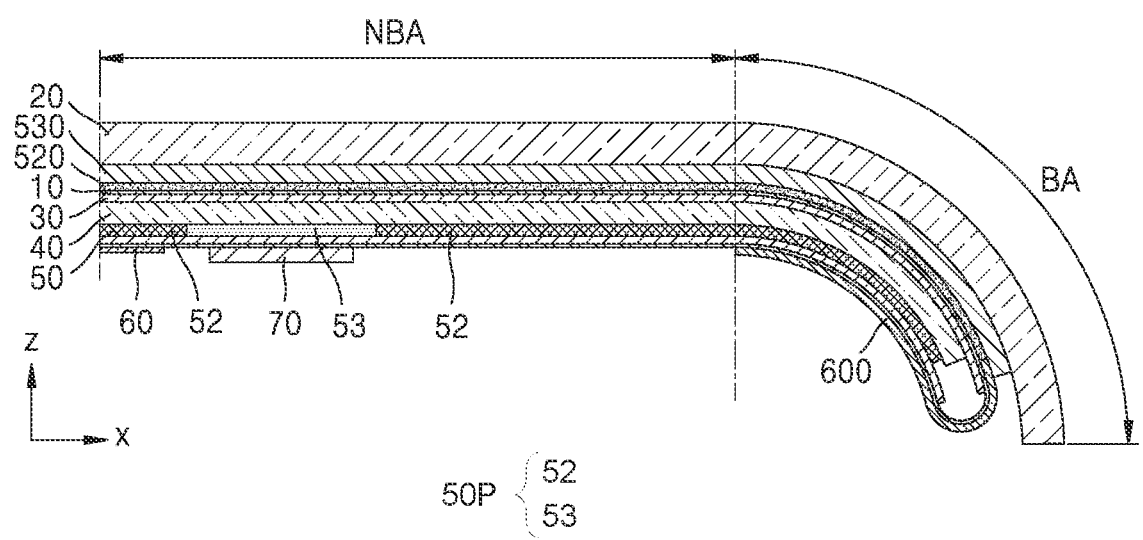
FIG. 8 is a cross-sectional view schematically illustrating a portion of the display apparatus according to another embodiment.

FIG. 8 is a cross-sectional view schematically illustrating a portion of the display apparatus 1 according to another embodiment.

In the area where the IC chip 70 is located, there is a drawback in that it is difficult to proceed with a process of applying force or pressure to the area, such as a pressing process, due to concerns about damage to the IC chip 70. According to the present embodiment, by applying a differentiated material to an area overlapping the IC chip 70 in a layer located under the IC chip 70, it is possible to buffer pressure or force applied to the IC chip 70 during a pressing process or the like.

As shown in FIG. 8, the display apparatus 1 according to the present embodiment may include the spacer 50 including a differentiated material at a portion under the IC chip 70 that overlaps the IC chip 70.

For example, the spacer 50 may include the second portion 52 in the non-bending area NBA and a third portion 53 positioned in the non-bending area NBA and overlapping (e.g., overlapping in the z direction) the IC chip 70. The patterned portion 50P may be the second portion 52 or the third portion 53.

In this case, the third portion 53 of the spacer 50 may include a material different from a material of a portion adjacent thereto. For example, the hardness of the material included in the third portion 53 may be less than that of the material included in a portion adjacent to the third portion 53 (e.g., the second portion 52). Therefore, the hardness of the third portion 53 of the spacer 50 may be less than that of a portion adjacent thereto Meanwhile, a material included in the third portion 53 may be the same as the material included in the first portion 51 described with reference to FIG. 7. For example, the third portion 53 may include porous material(s) such as foam(s). Accordingly, the third portion 53 of the spacer 50, which is located under the IC chip 70 overlapping the IC chip 70, may buffer a force or pressure applied to the area where the IC chip 70 is located during the manufacturing process (e.g., pressing process, etc.) or an external force applied to the area where the IC chip 70 is located when used after manufacturing. Through this, the spacer 50 may serve to prevent or substantially prevent damage to the IC chip 70 and cracks occurring in the area where the IC chip 70 is located.

Figure 9:
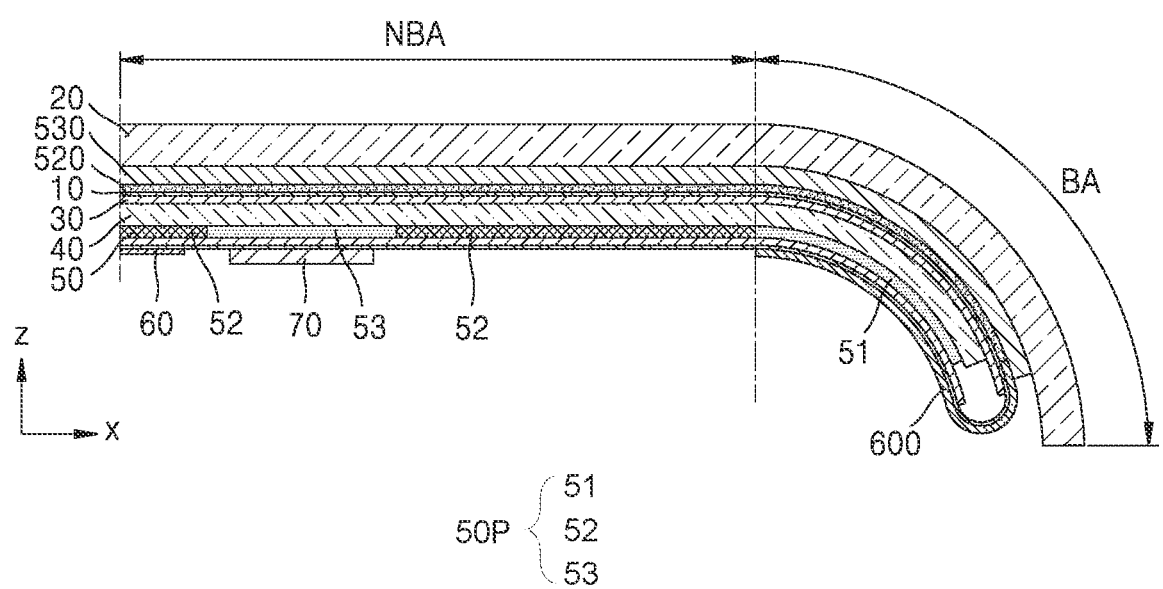
FIG. 9 is a cross-sectional view schematically illustrating a portion of the display apparatus according to another embodiment.

FIG. 9 is a cross-sectional view schematically illustrating a portion of the display apparatus 1 according to another embodiment.

As shown in FIG. 9, the display apparatus 1 according to the present embodiment may include the spacer 50 including a differentiated material in a portion thereof located in the bending area BA and in a portion thereof below the IC chip 70 that overlaps (e.g., overlaps in the z direction) the IC chip 70.

For example, the spacer 50 may include the spacer 50 including the first portion 51 in the bending area BA and the second portion 52 in the non-bending area NBA.

In this case, the first portion 51 and the third portion 53 of the spacer 50 may include a material different from a material of portions adjacent thereto. For example, the hardness of the material included in the first portion 51 may be less than that of the material included in the portion adjacent to the first portion 51 (e.g., the second portion 52), and the hardness of the material included in the third portion 53 may be less than the hardness of the material included in the portion adjacent to the third portion 53 (e.g., the second portion 52). Accordingly, the first portion 51 and the third portion 53 of the spacer 50 may have less hardness compared to the portions adjacent thereto. The patterned portion 50P may be the first portion 51, the second portion 52, or the third portion 53.

In an embodiment, the first portion 51 and the third portion 53 of the spacer 50 may include the same material. For example, as described above, the first portion 51 and the third portion 53 of the spacer 50 may include porous material(s) such as foam(s). In addition, the first portion 51 and the third portion 53 of the spacer 50 may have the same layered structure. That is, the first portion 51 and the third portion 53 of the spacer 50 may be concurrently (e.g., simultaneously) formed on the same layer in one process.

As shown in FIGS. 7-9, the display apparatus 1 according to an embodiment includes the spacer 50, wherein the spacer 50 may include at least one of the first portion 51 located in the bending area BA or the third portion 53 located in the bending area BA and overlapping (e.g., overlapping in the z direction) the IC chip 70. That is, the display apparatus 1 according to an embodiment may include the spacer 50 including only the second portion 52, the spacer 50 including the first portion 51 and the second portion 52, the spacer 50 including the second portion 52 and the third portion, and the spacer 50 including all of the first portion 51, the second portion 52, and the third portion 53.

Only the display apparatus has been mainly described above, but embodiments are not limited thereto. For example, for manufacturing such a display apparatus, methods of manufacturing a display apparatus should also fall within the scope of the disclosure.

According to an embodiment configured as described above, it is possible to implement a display apparatus in which the occurrence of defects in a manufacturing process or a use process after manufacturing can be significantly reduced. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
   a bending area and a non-bending area;
   a display panel comprising a first panel area, a second panel area, and a panel bending portion that is bent such that at least a portion of the first panel area overlaps a portion of the second panel area, the display panel being to have a curvature in the bending area; and
   a spacer between the first panel area and the second panel area, the spacer comprising a first portion in the bending area and a second portion in the non-bending area,
   wherein the first portion of the spacer is different in material from the second portion, and
   wherein the first portion of the spacer is to have a curvature in the bending area substantially equal to a curvature of the display panel in the bending area.

2. The display apparatus of claim 1, wherein the first portion is less in hardness than the second portion.

3. The display apparatus of claim 2, wherein the first portion comprises a porous material.

4. The display apparatus of claim 3, wherein the first portion has greater adhesive force than the second portion.

5. The display apparatus of claim 4, wherein the porous material comprises a pore filled with an adhesive.

6. The display apparatus of claim 1, further comprising an integrated circuit (IC) chip on the second panel area of the display panel.

7. The display apparatus of claim 6, wherein the spacer further comprises a third portion located in the non-bending area and overlapping the IC chip, and wherein the third portion is different in material from the second portion.

8. The display apparatus of claim 7, wherein the third portion is less in hardness than the second portion.

9. The display apparatus of claim 8, wherein the first portion is less in hardness than the second portion.

10. The display apparatus of claim 9, wherein the first portion and the third portion are the same in material.

11. The display apparatus of claim 10, wherein the first portion and the third portion each comprise a porous material.

12. The display apparatus of claim 9, wherein the first portion and the third portion are at the same layer.

13. The display apparatus of claim 1, further comprising a panel protective layer on a lower surface of the display panel, the panel protective layer being to have a curvature in the bending area substantially equal to the curvature of the display panel in the bending area.

14. The display apparatus of claim 13, wherein the panel protective layer comprises at least one of a light absorption layer to absorb light incident on the light absorption layer from the outside, a cushion layer to absorb an impact from the outside, or a heat dissipation layer to dissipate heat of the display panel.

15. The display apparatus of claim 1, further comprising a cover window on an upper surface of the display panel, the cover window being to have a curvature in the bending area substantially equal to a curvature of the display panel in the bending area.

16. A display apparatus comprising:
    a bending area and a non-bending area;
    a display panel comprising a first panel area, a second panel area, and a panel bending portion, the panel bending portion being between the first panel area and the second panel area and having a third panel area that is bent, wherein the display panel is to have a curvature in the bending area; and
    a spacer between the first panel area and the second panel area, the spacer being to have a curvature in the bending area substantially equal to the curvature of the display panel in the bending area, and having at least one patterned portion, the at least one patterned portion of the spacer being different in material from an adjacent portion of the spacer adjacent to the at least one patterned portion.

17. The display apparatus of claim 16, further comprising an integrated circuit (IC) chip on the second panel area of the display panel,
    wherein the at least one patterned portion of the spacer comprises at least one of a first portion located in the bending area, a second portion located in the non-bending area or a third portion located in the non-bending area and overlapping the IC chip.

18. The display apparatus of claim 17, wherein the first portion is less in hardness than the adjacent portion of the spacer adjacent to the first portion, and
    the third portion is less in hardness of the adjacent portion of the spacer adjacent to the third portion.

19. The display apparatus of claim 18, wherein the first portion and the third portion each comprise a porous material.

20. The display apparatus of claim 18, wherein the first portion and the third portion are at the same layer.

* * * * *